United States Patent [19]

Hosten

[11] Patent Number: 4,898,657
[45] Date of Patent: Feb. 6, 1990

[54] ELECTROPLATING APPARATUS FOR PLATE-SHAPED WORKPIECES

[75] Inventor: Daniel Hosten, Handzame, Fed. Rep. of Germany

[73] Assignee: Siemens Aktiengesellschaft, Berlin and Munich, Fed. Rep. of Germany

[21] Appl. No.: 371,634

[22] Filed: Jun. 26, 1989

[30] Foreign Application Priority Data

Jul. 7, 1988 [DE] Fed. Rep. of Germany ....... 3823071

[51] Int. Cl.⁴ .............................................. C25D 17/00
[52] U.S. Cl. ..................................... 204/198; 204/202
[58] Field of Search ........................ 204/198, 202, 203

[56] References Cited

U.S. PATENT DOCUMENTS 4,752,371 6/1988 Kreisel et al. ...................... 204/297
4,755,271 7/1988 Hosten .................................. 204/198

FOREIGN PATENT DOCUMENTS 0254030 6/1987 European Pat. Off. .
0254962 7/1987 European Pat. Off. .
3703549 9/1987 Fed. Rep. of Germany .
3624481 1/1988 Fed. Rep. of Germany .

Primary Examiner—T. M. Tufariello
Attorney, Agent, or Firm—Hill, Van Santen, Steadman & Simpson

[57] ABSTRACT

An electroplating apparatus, which has the workpieces, such as printed circuit boards, being conducted through an electrolyte solution in a horizontal path, has cathodic contacting by contact clamps, which move with the workpiece through the device. In order to guarantee a reliable supply of cathode current with a low thermal heating and a low wear of the contacts, which are also simultaneously resistant to the corrosion of the conducting parts, a live rail is provided that comprises a core composed of a material of high electrical conductivity, such as copper, and is covered by an envelope composed of a material having a high resistance to corrosion, such as titanium. Contact springs, preferably composed of titanium, are connected to the live rail in a mechanical and electrical conductive fashion, such as by spot welding, and engage each of the contact clamps as they move along the path.

12 Claims, 2 Drawing Sheets

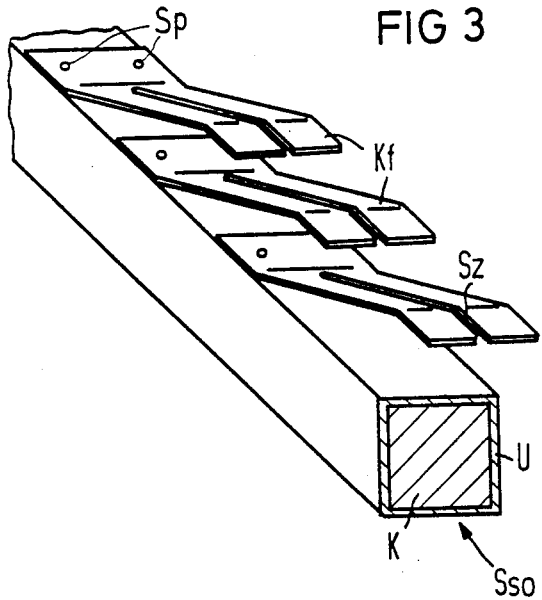

ELECTROPLATING APPARATUS FOR PLATE-SHAPED WORKPIECES

BACKGROUND OF THE INVENTION

The present invention is directed to an electroplating apparatus for plate-shaped workpieces which are treated as they are passed horizontally through the apparatus and along a plating path. The apparatus includes a plurality of contact posts which are arranged at a distance from one another and offset from the center of the path for movement along the path together with the workpiece for cathodic contacting of the workpieces. The apparatus is provided with an arrangement for supplying cathode current to the contact posts by at least one live rail having contact springs, which contact the post on the basis of a wiper contact.

An electroplating apparatus wherein a plate-shaped workpiece, such as a printed circuit board is moved in a horizontal path through the apparatus is disclosed in my U.S. Pat. No. 4,755,271, whose disclosure is incorporated by reference and which claims priority from German Application No. 36 25 483, which was the basis for European Application No. 0 254 962. In the arrangement of this patent, the workpiece to be electroplated, in particular a printed circuit board, was conducted in a horizontal throughput path through a treatment cell that contains an electrolyte solution. In order to guarantee a reliable cathodic contacting of the moving workpiece, at least one forceps-shaped contacting post which is movable along the path, together with the workpiece, is provided. An endless drive is preferably provided as a displaceable carrier for a plurality of the contact posts, which are arranged at a distance from one another. Thus, the drive also serves as means for conveying the workpiece through the treatment cell. In one of the embodiments set forth in the above-mentioned U.S. Patent, an upper and lower toothed belt are provided and support posts on which the clamping jaws are carried and the clamping jaws are supplied with the cathode current by brushes.

In an electroplating device disclosed in published German OS No. 36 24 481, a plate-shaped workpiece is treated as it moves in a horizontal path, and a supply of cathode current to the contact posts or clamps, which are carried by endless belts or chains, also occurs by a stationary brush arrangement that presses against the contact posts or clamps.

The cathodic contacting of plate-shaped workpieces set forth above is far less sensitive to contact with electrolyte solutions than are roller contacts and wire contacts. In view of the required displaceability of the contact posts or clamps, however, a power transmission between the stationary and moving parts continues to be required, whereas the corresponding contacting can now be displaced into an area that is protected against the access of electrolyte solution and other negative influences.

Given electroplating with current densities of, for example, 10 A/dm$^2$ and more, a high thermal load occurs in the region of the power transmission between resting and moving parts. Particularly given the employment of brush arrangements, the brushes ar highly heated when subjected to such current densities so that a premature wearing of these brushes will occur.

SUMMARY OF THE INVENTION

The object of the present invention is to improve the cathodic contacting of the moving workpiece in an electroplating apparatus of the above type in view of the thermal load or heat and also in view of the wear resulting therefrom. It is also desirable that the required resistance to corrosion should be guaranteed at the same time.

These objects are achieved in an improvement in an electroplating apparatus for plate-shaped workpieces which are treated as they move through an electroplating cell in a horizontal path, said apparatus comprising a plurality of contact clamps arranged at a distance from one another and displaceable along the path with the workpiece for cathodic contacting of the workpiece, means supplying the cathode current to the contact clamps by at least one live rail having contact springs working on the basis of a wiper contact. The improvements comprising that each live rail is formed of a core composed of a material having a high electrical conductivity and surrounded by an envelope or layer of material having a high resistance to corrosion, each of the contact springs being composed of a material having a high resistance to corrosion and each of the contact springs being connected to the live rail mechanically in an electrically conductive fashion.

The invention is based on the perception that a solidly fashioned live rail composed of a material having a high electrical conductivity will allow extremely high currents to be transmitted to the contact springs, which are secured thereto. In addition, the live rail will be protected by an envelope or layer composed of a material having a high resistance to corrosion, and the contact springs themselves are also composed of a corrosion-resistant material. Too great a heating of the power transmitting parts and a premature wear caused as a result of this great heating can, therefore, be avoided.

It has proven especially beneficial, in view of the selection of the materials to be used for the rail, to have the core being of a material selected from a group consisting of copper and copper alloys, and the envelope or layer being of a material selected from a group of materials consisting of titanium and titanium alloys. It has also been beneficial for the contact springs to be composed of a material selected from a group consisting of titanium and titanium alloys.

The mechanically and electrically conductive connection between the contact springs and the live rail is undertaken in a simple way and very effectively by welding, wherein spot welds have proven particularly useful.

In addition, it has proven advantageous in view of the heating of the contact springs when at least one slot extends in the direction of movement of the material through the cell is provided in each of the contact springs.

Other features and advantages of the present invention will be readily apparent from the following description of the preferred embodiments, the drawings and claims.

BRIEF DESCRIPTION OF THE DRAWINGS

FIG. 3 is a perspective view with portions broken away for purposes of illustration of a live rail and contact springs for the contacting mechanism of FIGS. 1 and 2.

DESCRIPTION OF THE PREFERRED EMBODIMENTS

Figure 1:
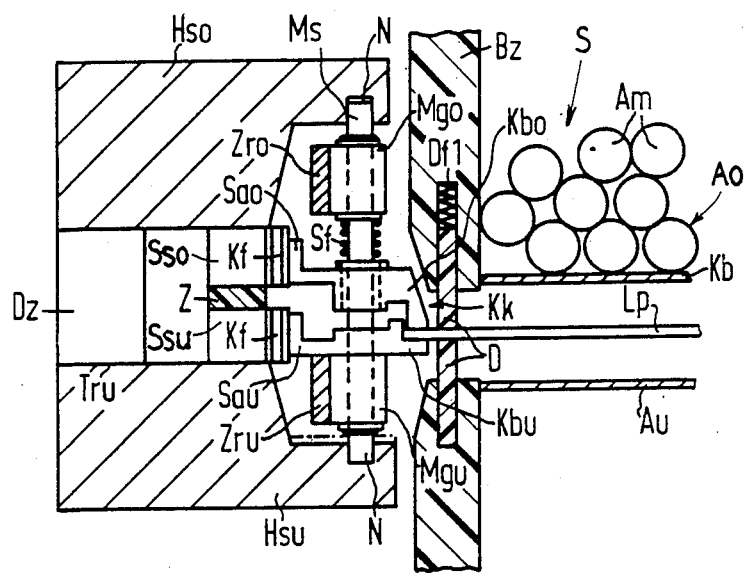
FIG. 1 is a cross sectional view with portions in elevation for purposes of illustration, of one side of a contacting arrangement for printed circuit boards and for conveying them in a horizontal path through the apparatus of the present invention.

The principles of the present invention are particularly useful for an improvement in a cathodic contacting of electroplating apparatus for printed circuit boards to be treated as they move in a horizontal path through an electroplating apparatus, generally indicated at S in FIG. 1. Briefly, the electroplating apparatus is substantially the same as that illustrated in the above-mentioned U.S. Pat. No. 4,755,271.

As illustrated in FIG. 1, the contacting arrangement is disposed outside of a lateral wall Bz of a treatment cell, which has an upper anode Ao formed by a basket Kb containing anode material Am. A printed circuit board Lp, which is to be electroplated, is passed along the horizontal path which would extend perpendicular to the plane of the drawing of FIG. 1 and in a direction of an arrow P of FIG. 2. The path for the printed circuit board Lp extends between the upper anode Ao and a lower anode Au. As illustrated in FIG. 1, the printed circuit board Lp has a lateral edge region which extends through the wall Bz of the treatment cell, which wall has a slot-shaped opening extending along the throughput direction of the path P, which is closed by a seal D. The seal D is composed of a lower rigidly arranged sealing member and of an upper sealing member that can be moved in a vertical direction and is pressed against the printed circuit board Lp by compression springs Df1. The sealing members of the seal D are composed, for example, of a polytetrafluorethylene which has the job of molding against the surface of the passing printed circuit board Lp and of, at least, largely preventing any emergence of electrolyte solution from the cell.

The laterally extending edge of the printed circuit board Lp, which projects through the seal D is seized for cathodic contacting by a plurality of contact posts or clamps Kk that are arranged spaced one from another and are constructed as forcepslike clamps. Each of these contact posts or clamps Kk is composed of an upper clamp jaw Kbo and of a lower clamp jaw Kbu. Both clamp jaws are arranged for displacement on a pair of vertically extending dog pins Ms. The dog pins Ms are, in turn, held in dog elements Mgo of an upper toothed belt Zro and dog elements Mgu of a lower toothed belt Zru. The toothed belts Zro and Zru could, if desired, be constructed as chain belts and each form an endless drive for carrying the contact posts Kk along an oval track with one leg extending parallel to the path P. The upper ends of the dog pins Ms of the individual contact posts Kk are, additionally, also guided in a U-shaped channel N of an upper retaining rail Hso, whereas the lower ends are guided in a corresponding channel N of a lower retaining rail Hsu. The upper and lower retaining rails Hso and Hsu, for example, are composed of a high molecular polyethylene and are firmly joined to one another by spacer pins Dz. The longitudinal guidance of the dog pins Ms of the contact posts Kk in the two channels N is restricted to the region in which the printed circuit boards Lp are to be cathodically contacted and in which the two toothed belts drive together with the contact posts simultaneously fulfill the job of a transport means for horizontal transport of the printed circuit board along the path P. This guidance is eliminated in the reversing regions or curve portions of the oval track for the toothed belt drive and in the region of the return side or leg.

The upper clamp jaws Kbo and the lower clamp jaws Kbu of the contact posts Kk are movably guided on, respectively, two dog pins Ms between the upper toothed belts Zro and the lower toothed belts Zru. The pressure required for closing the contact clamp Kk and for reliably contacting the printed circuit boards Lp is exerted by closing springs Sf that are coil springs arranged on each dog pin Ms between the dog element Mgo and the upper jaw Kbo.

An angular power pick-up Sao is applied to the upper clamp jaw Kbo on a backside thereof, and this power pick-up Sao slides on contact springs Kf for the transmission of the cathode current. These contact springs Kf are secured to an upper live rail Sso. In a corresponding fashion, an angular power pick-up Sau is applied to the lower clamp jaw Kbu on a backside thereof. This power pick-up Sau slides on contact springs Kf for the transmission of the cathode current, and these contact springs Kf are secured to a lower live rail Ssu. The live rails Sso and Ssu, whose structure is set forth in greater detail in FIG. 3, are clamped between the retaining rails Hso and Hsu and separated by an intermediate insulating ply Z. The described nature of the power transmission comprising the power pick-ups Sao and Sau and the live rails Sso and Ssu, as well as the arrangement of the closing springs Sf, makes it possible to use the contact clamps Kk for different thicknesses of printed circuit boards Lp without the contact pressure thereby being significantly changed.

Equipping the contact clamps Kk with closing springs Sf means that the contact clamps Kk must be forcibly opened in the admission region for seizing the printed circuit boards Lp and in the discharge region for releasing the printed circuit boards Lp. To this end, link motions whose structure and functions proceed from the above-mentioned U.S. Patent are provided for this purpose at the admission and discharge regions of the printed circuit board.

Figure 2:
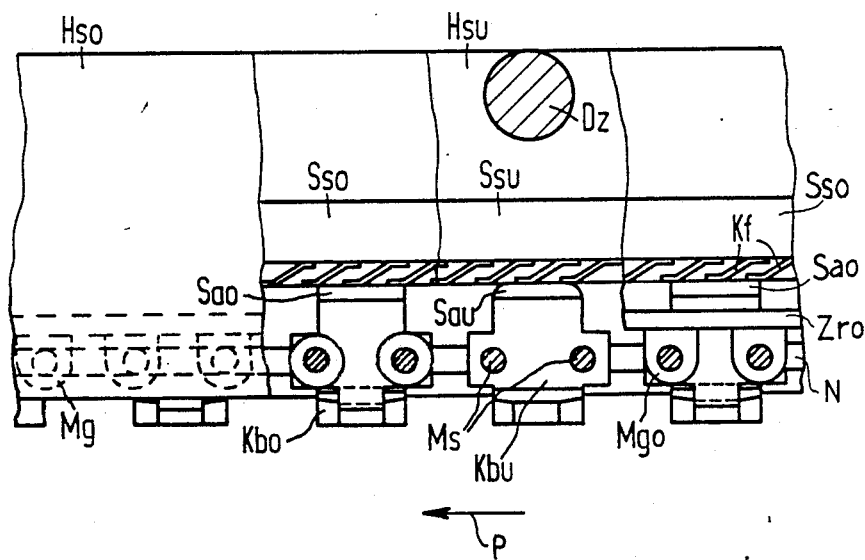
FIG. 2 is a partial top plan view with portions broken away to show different levels of the contacting mechanism of Fig. 1.

The improvements of the present invention are best illustrated in FIG. 3, wherein the upper live rail Sso, together with the contact springs Kf, are shown. As it can be seen, the upper live rail Sso is composed of a solid core K and of an envelope or cladding layer U. The contact springs Kf, respectively, are provided with slots Sz, which extend in a longitudinal direction, and each of the contact springs are joined to the envelope U with two spot welds Sp. The core K of the live rail Sso is composed of a material having a high electrical conductivity, particularly a material selected from a group consisting of copper or copper alloys. The envelope U is composed of a material having a high resistance to corrosion, particularly a material selected from a group consisting of titanium or titanium alloys. Each of the contact springs, which has a double bend to form a Z-type shape, as illustrated in FIG. 2, are dimensioned so that it will press resiliently against the allocated upper power pick-up Sao, as illustrated in FIG. 2, and exert a contact pressure required for power transmission. In addition to exhibiting these resilient properties, the contact springs Kf must also exhibit the required resistance to corrosion and are preferably formed of titanium or a titanium alloy. It should be noted, however, that it is possible to construct each of the contact springs Kf of an elastic core and of a corrosion-resistant envelope or jacket, so that the required electrical conductivity must also be guaranteed in all cases set forth above.

The lower rail Ssu is constructed in the same manner as the above-described upper rail Sso.

The described power supply by the titanium-enveloped copper bar or rod having a titanium spring welded thereto prevents an excessive heating in the region of the wiping contact and, thus, prevents a premature wear. In addition, the required corrosion resistance of all power transmitting parts is also guaranteed.

Although various minor modifications may be suggested by those versed in the art, it should be understood that I wish to embody within the scope of the patent granted hereon all such modifications as reasonably and properly come within the scope of my contribution to the art.

I claim:

1. In an electroplating apparatus for plate-shaped workpieces which are being transported in a horizontal path through an electroplating cell of the apparatus, said apparatus comprising a plurality of contact clamps arranged at a distance from one another and laterally displaced outside of the cell for gripping an edge of the workpiece for cathodic contacting of the workpiece, a cathode current being supplied to the contact clamps by at least one live rail and by contact springs on the basis of a wiping contact, the improvements comprising said live rail comprising a core composed of a material having electrical conductivity and being provided with an envelope composed of a material having a high resistance to corrosion, each contact spring being composed of a material having a high resistance to corrosion, and said contact springs being connected to the live rail mechanically in an electrically conductive fashion.

2. In an electroplating apparatus according to claim 1, wherein each of the contact springs is provided with at least one slot extending in the direction of the movement of the clamps through the apparatus.

3. In an electroplating apparatus according to claim 1, wherein the contact springs are joined to the envelope by welding.

4. In an electroplating apparatus according to claim 3, wherein each of the welds is a spot weld.

5. In an electroplating apparatus according to claim 3, wherein each of the contact springs has at least one slot extending in the direction of movement of the clamps through the apparatus.

6. In an electroplating apparatus according to claim 1, wherein each of the contact springs is composed of a material selected from a group consisting of titanium and titanium alloys.

7. In an electroplating apparatus according to claim 1, wherein the envelope is a material selected from a group consisting of titanium and titanium alloy.

8. In an electroplating apparatus according to claim 1, wherein the core of the live rail is of a material selected from a group consisting of copper and copper alloys.

9. In an electroplating apparatus according to claim 8, wherein the envelope is composed of a material selected from a group consisting of titanium and titanium alloys.

10. In an electroplating apparatus according to claim 9, wherein each of the contact springs is composed of a material selected from a group consisting of titanium and titanium alloys.

11. In an electroplating apparatus according to claim 10, wherein each of the contact springs is joined to the envelope by spot welds.

12. In an electroplating apparatus according to claim 11, wherein each of the contact springs has a slot extending in the direction of movement of the workpiece through the apparatus.

* * * * *